United States Patent [19]
Ahn et al.

[11] Patent Number: 5,834,405
[45] Date of Patent: Nov. 10, 1998

[54] SUPERCONDUCTING MULTILAYER CERAMIC SUBSTRATE

[75] Inventors: Byung Tae Ahn, Cupertino; Robert Bruce Beyers, San Jose, both of Calif.; Emanuel Israel Cooper, Riverdale, N.Y.; Edward August Giess, Purdys, N.Y.; Eugene John O'Sullivan, Upper Nyack, N.Y.; Judith Marie Roldan, Ossining, N.Y.; Lubomyr Taras Romankiw, Briarcliff Manor, N.Y.

[73] Assignee: International Business Machines Corporation, Armonk, N.Y.

[21] Appl. No.: 839,707

[22] Filed: Feb. 24, 1992

Related U.S. Application Data

[63] Continuation of Ser. No. 526,403, May 18, 1990, abandoned.

[51] Int. Cl.$^6$ .................................................. H01L 39/00
[52] U.S. Cl. .......................... 505/236; 505/237; 505/238; 505/220; 505/230; 505/232; 505/701; 505/703; 505/704; 428/701; 428/702; 428/209; 428/457; 428/901; 428/930
[58] Field of Search .................................. 505/700, 291, 505/702, 704, 703, 1, 220, 230, 232, 236, 237, 238; 428/688, 689, 701, 702, 901, 930, 209, 457

[56] References Cited

U.S. PATENT DOCUMENTS

| | | | |
|---|---|---|---|
| 4,872,086 | 10/1989 | Huang et al. | 361/321 |
| 4,885,273 | 12/1989 | Sugimoto | 505/1 |
| 4,954,480 | 9/1990 | Imanaka et al. | 505/701 |
| 4,954,481 | 9/1990 | DeReggi | 505/1 |
| 4,965,249 | 10/1990 | De With et al. | |
| 4,994,435 | 2/1991 | Shiga | 505/1 |
| 5,047,388 | 9/1991 | Rohr et al. | |
| 5,049,539 | 9/1991 | Smialek | 505/1 |
| 5,087,605 | 2/1992 | Hedge | 505/1 |
| 5,104,849 | 4/1992 | Shiga | 505/1 |
| 5,175,141 | 12/1992 | Takemura | 505/1 |

FOREIGN PATENT DOCUMENTS

| | | | |
|---|---|---|---|
| 0290271 | 11/1988 | European Pat. Off. | |
| 0237314 | 3/1988 | Japan | 505/1 |
| 349375 | 11/1989 | Japan | 505/1 |
| 0183915 | 7/1990 | Japan | 505/701 |

OTHER PUBLICATIONS

Japanese Journal Appl. Phys., vol. 27, No. 7, Jul. 1988, pp. L1261–L1270 Weng et al.
Japanese Journal of Applied Physics, Letters vol. 28, No. 6, Jun. 1989, Tokyo JP pp. 984–986; M. Yoshimoto et al: "Preparation of a Bi–Sr–Ca–Cu–O high $T_c$ superconductor by the reaction of a Cu–free precursor with Cu plate".
Patent Abstracts of Japan, vol. 013, No. 496, (E–843) 09 Nov. 89, & JP–A–01 199454 (Fujitsu) 10 Aug. 1989.
"Paths to Higher Temperature Superconductors," Science vol. 259, 12 Mar. 1993, pp. 1550–1551.
"Theoretical Resistance" Scientific American Dec. 1992, pp. 24–25.
Doss, Engineers Guide to High–T–Superconductivity, Wiley & Sons, 1989 pp. 105–108.
Tarascon et al "Oxygen and Rare Earth Doping of the 90K Superconducting Perovskite $YBa_2Cu_3O_{7-x}$," *Physical Review B*, vol. 36, No. 1, pp. 226–234 (Jul. 1987).
Arima et al, "Extended Family of New Bi–2222 Superconducting Cuprates $Bi_2Sr_2(RE_{1-x}Ce_x)_2Cu_2O_{10+y}$", *Physica C*, vol. 168, pp. 79–84 (1990).
Tokura et al "A Superconducting Copper Oxide Compound With Electrons as the Charge Carriers" *Nature*, vol. 337, No. 26, pp. 345–347 (Jan. 1989).
Ishida et al, "Critical Temperature Control of $Bi_2Sr_2CuO_x$ By Quenching", *Physica C*, vol. 167, pp. 258–262 (1990).
Derek W. Smith, An Acidity Scale for Binary Oxides:, *Journal of Chemical Education*, vol. 64, No., 6 pp. 480–481 (Jun. 1987).
Tatsumi et al, *Jpn. J. Appl. Phys.*, vol. 31, Part 2, No. 4A, pp. 392–395 (Apr. 1992).
Saito et al, "High–$T_c$ Superconducting Properties In $(Y_{1-x}Tl_x)Ba_2Cu_3O_{7-y}$, $Y(Ba_{1-x}K_x)_2Cu_3O_{7-y}$ and $YBa_2(Cu_{1-x}Mg_x)_3O_{7-y}$", *Physica B*, vol. 148, pp. 336–338 (1987).
Fuertes et al, "Oxygen Excess and Superconductivity at 45 K in $La_2CaCu_2O_{6+y}$", *Physica C*, vol. 170 pp. 153–160 (1990).
Takagi et al, "Superconductivity Produced by Electron Doping in $CuO_2$–Layered Compounds", *Physical Review Letters*, vol. 62, No. 10, pp. 1197–1200 (Mar. 1989).
Zandbergen et al, "The Effect of the Oxygen Content in $Pb_2SrLaCu_2O_{6+o}$ and $Pb_2Ba_2YCU_3O_{8+o}$ on the Structural and Superconducting Properties", *Physica C*, vol. 166, pp. 502–512 (1990).
Veal et al, "Superconductivity in $YBa_{2-x}Sr_xCu_3O_{7-o}$", *Appl. Phys. Lett.*, vol. 51, No. 4, pp. 279–281 (Jul. 1987).
Dalichaouch et al, "Superconducting and Normal State Properties of $Y_{1-x}M_xBa_2Cu_3O_{7-o}(M=Pr, Na)$", *Solid State Communication*, vol. 65, No. 9, pp. 1001–1006 (1988).
CA 114:15684 x.
CA 114:53754 c.
CA 114:175913 z.
Japanese Journal of Applied Physics, vol. 26, No. 7 (Jul. 1987), pp. L1172–L1173 (Kumakura et al), entitled "Ba–Y–Cu–O Superconducting Tape Prepared by Surface Diffusion Process".

*Primary Examiner*—Marie R. Yamnitzky
*Attorney, Agent, or Firm*—Sughrue, Mion, Zinn, Macpeak & Seas, PLLC

[57] ABSTRACT

A superconducting multilayer ceramic substrate is disclosed, prepared by firing a laminate of at least two polymer bonded cast sheets of a ceramic dielectric oxide powder, at least one sheet of which has a metallization pattern provided thereon, to thereby form a superconducting oxide reaction layer at the interface between the sintered ceramic material and the embedded metallic conductor lines of the metallization pattern.

35 Claims, 2 Drawing Sheets

SUPERCONDUCTING MULTILAYER CERAMIC SUBSTRATE

This is a Continuation of application Ser. No. 07/526,403 filed May 18, 1990 (now abandoned).

FIELD OF THE INVENTION

The present invention relates to a superconducting ceramic substrate, and in particular, to a superconducting multilayer ceramic substrate which also operates at temperatures above the superconducting transition temperature of a constituent superconducting oxide reaction layer.

BACKGROUND OF THE INVENTION

The application of superconducting ceramics to enhance the efficiency of electrical signal propagation is presently a major focus of investigators intention. For example, Hiroaki Kumakura et al, in *Ba—Y—Cu—O Superconducting Tape Prepared by Surface Diffusion Process*, Japanese Journal of Applied Physics, Vol. 26, No. 7, pp. L1172-L1173 (July 1987), disclose a method of fabricating Ba—Y—Cu—O composite tapes for use as the solenoid windings of a superconducting magnet, by reacting a Cu substrate with a mixture of $BaCO_3$ and $Y_2O_3$ powders. On the other hand, European patent application No. 0290271 discloses a superconducting circuit board for use in a high speed computer such as a supercomputer. The superconducting circuit board of European patent application No. 0290271 comprises a superconducting ceramic pattern provided on an alumina board.

The high $T_c$ superconducting ceramics, including for example, the Y—Ba—Cu—O and the Bi—Si—Ca—Cu—O systems, exhibit superconductivity at the boiling point of nitrogen (77° K.), yet have high resistance at temperatures above their respective superconducting transition temperatures. Thus, the various superconducting ceramics hitherto developed are not practically useful at operating temperatures above the superconducting transition temperature.

Accordingly, it has been desired to provide a superconducting substrate which operates (i.e., conducts electricity) in a superconducting mode at temperatures below the superconducting transition temperature, and which also operates in a normal metallic conduction mode above its superconducting transition temperature. Such a superconducting substrate could advantageously be employed, for example, as a device-carrying substrate of a computer which operates in a standby mode at normal operating temperatures, and is then converted to a supercomputer by cooling the substrate below the superconducting transition temperature as required.

High $T_c$ oxide superconductors may be formed, for example, by firing a ceramic paste comprising stoichiometric amounts of a superconducting composition on a support to form a superconducting ceramic pattern, as disclosed in European patent application No. 0290271. On the other hand, the copper component of a superconducting composition may be provided by firing a copper substrate together with stoichiometric quantities of $BaCO_3$ and $Y_2O_3$ powders to form a superconducting tape, as described in Kumakura et al. In this case, a portion of the copper substrate is consumed in the formation of a Ba—Y—Cu—O superconducting ceramic. In Kumakura et al, the mixture of $BaCO_3$ and $Y_2O_3$ powders are completely reacted with the Cu substrate by firing in air at 900°–950° C. for ten minutes to three hours, to form a tape comprising a Cu substrate having thereon, in order from the substrate, a relatively thick $Cu_2O$ layer and a superconducting oxide layer. Following the method of Kumakura et al, the Cu substrate would normally be entirely converted to $Cu_2O$ in the oxidizing firing step, if a large excess of Cu was not used.

On the other hand, in one embodiment of the present invention, a metallic conductor embedded in a $Ba_4Y_2O_7$ (DBYO) ceramic dielectric oxide is first co-fired in a substantially non-oxidizing atmosphere. The substrate is then annealed in a lower temperature oxygen-containing atmosphere to thereby optimally oxidize the superconducting oxide reaction layer which forms at the interface between the sintered dielectric oxide and the metallic conductor, without oxidizing the core of the metallic conductor. Thus, the present invention is different from Kumakura et al with respect to the starting materials, the structure and effect of the final product, and the processing methods employed. Particularly, the superconducting tape of Kumakura et al is prepared by co-firing the Cu substrate and oxide powders at a relatively high temperature in an oxidizing environment, whereas the processing method in accordance with the present invention minimizes the rate of formation of $Cu_2O$ with respect to the rate of formation of the superconducting oxide layer. The minimization of unwanted phases is an important aspect of the present invention, as described in further detail below.

The thermodynamic properties of a system comprising a co-fired ceramic dielectric oxide and a metal to thereby form a high $T_c$ superconducting oxide reaction layer of the Ba—Y—Cu—O system mitigate against direct contact of the resulting superconducting layer with the metal. For example, in the Ba—Y—Cu—O system, an initial $Ba_4Y_2O_7$ (DBYO)—Cu quaternary diffusion couple would ideally react to form a single phase intermediate layer of a superconducting $Ba_2Y_1Cu_3O_{7-\delta}$ ceramic (hereinafter a 123 compound, wherein δ is a deviation in the amount of oxygen from the stoichiometric amount thereof), resulting in a structure consisting of adjacent layers of DBYO, 123 and Cu. However, the present inventors have found that there is no temperature and oxygen partial pressure regime in which these three phases are in thermodynamic equilibrium with each other. In fact, there is no regime where the DBYO-123 and 123-Cu interfaces are thermodynamically stable when in contact with one another, and additional phases tend to form between these phases during processing. The major unwanted phases that tend to form include a "132" $Y_1Ba_3Cu_2O_{6.5+\delta}$ phase between the superconducting 123 oxide and the DBYO bulk, and an insulating $Cu_2O$ phase between the 123 superconducting oxide and the Cu substrate. This insulating $Cu_2O$ phase is clearly seen in FIG. 1 of Kumakura et al. Thus, the processing conditions used to form a superconducting ceramic substrate of the present invention which also operates at temperatures above the superconducting transition temperature must take advantage of kinetic limitations to form, as closely as possible, an ideally layered structure, while minimizing additional, unwanted phases.

The diffusion path in a quaternary system cannot be predicted a priori, but our thermodynamic data is useful in determining where the optimum processing conditions lie. FIG. 1 shows the changes in the quaternary phase relationships at 850° C. as the oxygen partial pressure is reduced. The eight changes in the diagram (labelled I to VIII in FIG. 1), correspond to eight oxygen pressure plateaus as obtained in coulometric titrations. FIG. 2 shows the temperature dependence of these plateaus.

It is seen that there is a stable tie line between $Y_2Ba_1Cu_1O_5$(211) and $BaCuO_2$ above oxygen plateau pressure IV. If there are no nucleation barriers, it is likely that these two unwanted phases will form between DBYO and 123. Below plateau IV, however, there is a tie line between $Y_1Ba_3Cu_2O_{6.5+\delta}$ ("132") and 123. Note that "132" is only the nominal composition for this phase, the "other perovskite" in the Y—Ba—Cu—O system. Thus, annealing the DBYO—Cu couple in an oxygen pressure below plateau IV is likely to minimize the number of unwanted phases between DBYO and 123; i.e., primarily "132" may form.

The number of unwanted phases that form might also be reduced by adjusting the Y:Ba ratio of the DBYO starting material. While a 1Y:2Ba ratio would clearly be best if the DBYO was completely consumed in the diffusion couple, this is not necessarily the case when a DBYO layer remains. For example, if "132" was indeed the primary phase formed between DBYO and 123 below plateau IV, then by conservation of mass, a small amount of a Y-rich phase such as 211 would also form. However, if the starting composition of DBYO was made Ba-rich, then the formation of the Y-rich phase could be reduced or eliminated.

It is seen that there is also a stable tie line between 211 and $BaCu_2O_2$ below plateau VI. It is likely that these two unwanted phases (and $Cu_2O$) would form between 123 and Cu if the substrate was annealed in an oxygen pressure below plateau VI. Consequently, the best temperature-oxygen pressure regime in which to anneal the DBYO-Cu couple is between plateau IV and plateau VI, the shaded region in FIG. 2. The major unwanted phases that are likely to form in this regime are "132" and $Cu_2O$. It is also possible that a liquid phase (L in FIG. 1) may form between 123 and Cu. This liquid formation can be prevented by further restricting the oxygen pressure to lie below plateau V. In practice, the optimum temperature-oxygen pressure regime may be found at slightly higher oxygen pressures (the shaded region in FIG. 2 may be shifted up) because there will be an oxygen activity gradient through the diffusion couple. The oxygen activity at the DBYO surface will be higher than that in the copper core. The oxygen activity at the DBYO surface can be controlled by equilibration with the gas phase, but it is the oxygen activity within the couple that determines which phases can form locally within the couple.

The formation of $Cu_2O$ between 123 and Cu appears unavoidable between plateau IV and plateau VI. Annealing in a reduced oxygen pressure, however, will decrease the flux of oxygen through 123, thereby limiting the amount of $Cu_2O$ that forms. Moreover, forming 123 by giving the DBYO-Cu couple a rapid anneal at high temperature should further reduce the amount of $Cu_2O$ that forms.

After rapidly forming the 123 phase at high temperature (850°–950° C.) in a reduced oxygen pressure, a final anneal at low temperature (400°–500° C.) in 1 atm oxygen followed by slow cooling would make the 123 layer into a bulk, above liquid nitrogen temperature superconductor. The low temperature used in this final anneal would also minimize additional oxidation of the Cu layer.

The above observations also apply to the case of a superconducting substrate made by depositing 1Y:2Ba:3Cu directly on a Cu layer. A rapid, high-temperature anneal in a reducing ambient to crystallize the 123 phase, followed by a low-temperature anneal in an oxidizing ambient to make the 123 layer a bulk, above liquid nitrogen superconductor, should result in a superconducting substrate with optimal properties.

SUMMARY OF THE INVENTION

An object of the present invention is to provide a superconducting ceramic substrate which also operates at temperatures above the superconducting transition temperature of a constituent superconducting oxide reaction layer.

A second object of the present invention is to provide a superconducting multilayer ceramic (MLC) substrate which also operates at temperatures above the superconducting transition temperature of a constituent superconducting oxide reaction layer.

A third object of the present invention is to provide a superconducting ceramic substrate as described in the above-noted first and second objectives, which also operates at temperatures above the superconducting transition temperature, wherein the formation of unwanted insulating phases between the superconducting oxide reaction layer and an embedded metallic conductor is minimized.

Other objectives of the present invention will become apparent from the following description and Examples.

The present inventors have discovered that the first and third objectives are attained by a superconducting ceramic substrate prepared by co-firing at least one metallic conductor embedded in a ceramic dielectric oxide, to thereby form a superconducting oxide reaction layer at the interface between the sintered ceramic material and the at least one metallic conductor.

The present inventors have also discovered that the above objectives are attained by a superconducting multilayer ceramic substrate prepared by firing a laminate of at least two polymer bonded cast sheets of a ceramic dielectric oxide powder, at least one sheet of which has a metallization pattern provided thereon, to thereby form a superconducting oxide reaction layer at the interface between the sintered ceramic material and the embedded metallic conductor lines of the metallization pattern.

It is to be understood that both the foregoing general description and the following detailed description are exemplary and explanatory, but are not restrictive of the invention. For example, the superconducting layer formed by reaction of "thick" film ceramic oxide dielectric with a metallic conductor could also be formed with "thin" film technology in a configuration having smaller dimensions to give denser circuitry with shorter (faster) conductor paths. Reaction times for processing would tend to be shorter and temperatures lower in this case.

DETAILED DESCRIPTION OF THE DRAWINGS

Figure 1:
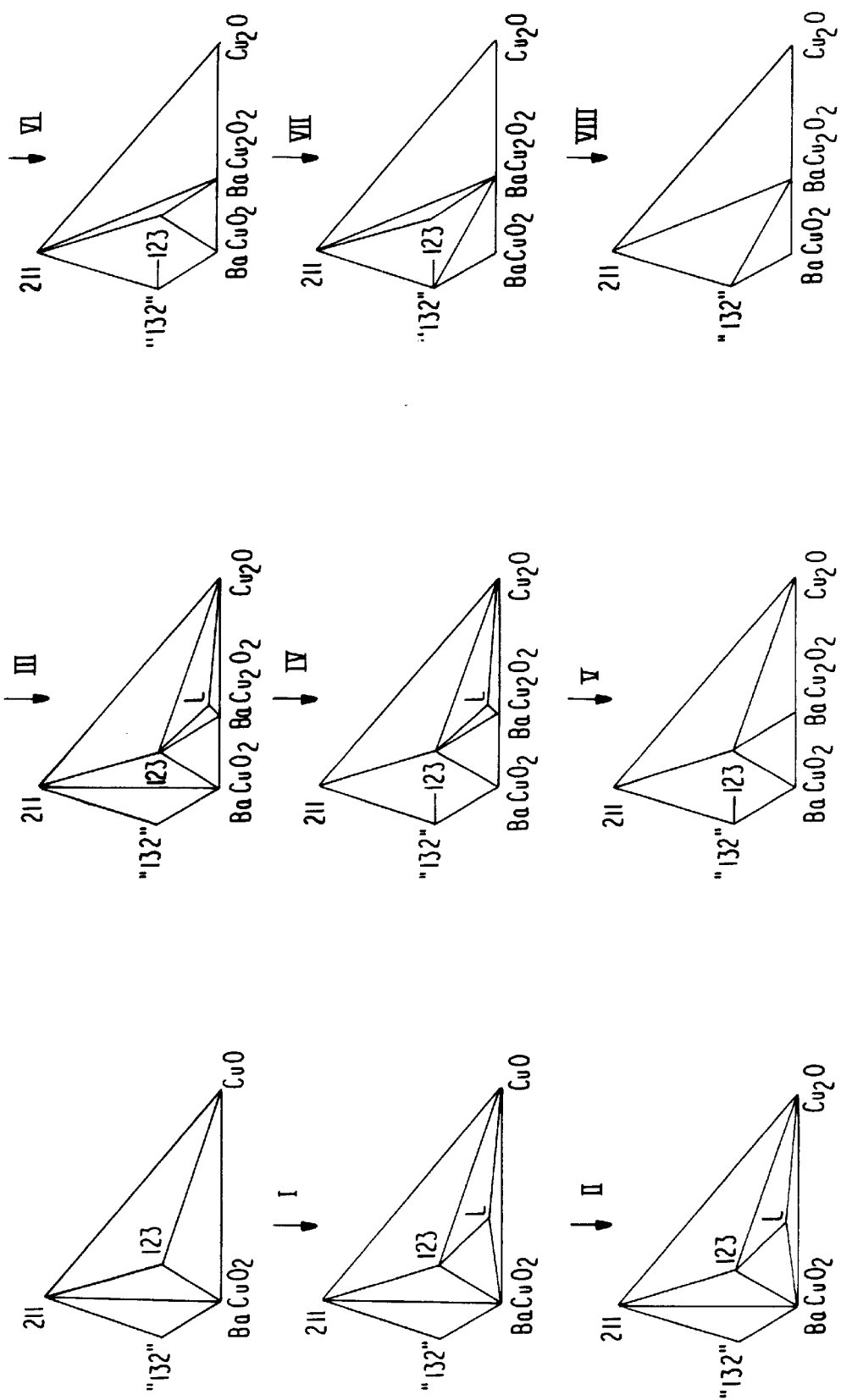

FIG. 1 shows how the Y—Ba—Cu—O phase diagram near $Y_1Ba_2Cu_3O_{7-\delta}$ ("123") changes as the oxygen pressure is reduced at 850° C. The oxygen pressure plateaus (labelled I through VIII) determine the range of oxygen pressure over which each pseudoternary section is valid.

Figure 2:
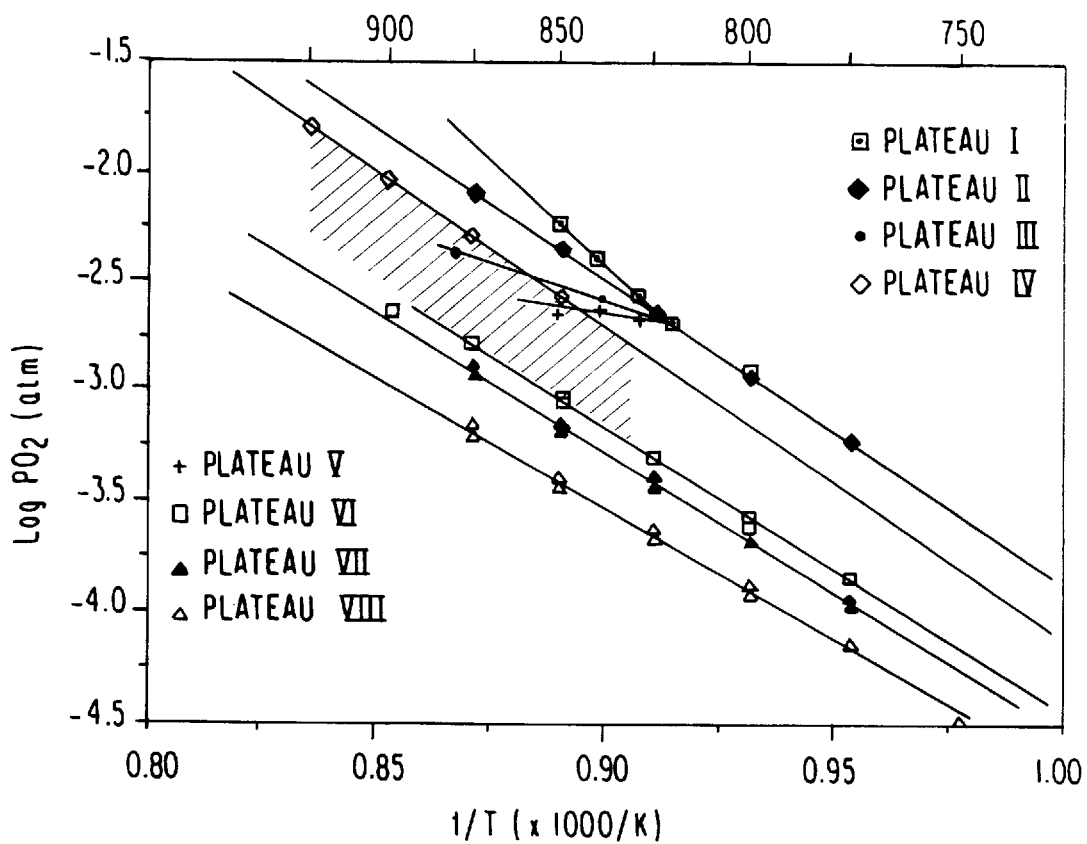

FIG. 2 graphically represents the temperature dependence of the eight oxygen pressure plateaus of FIG. 1.

DETAILED DESCRIPTION OF THE INVENTION

The superconducting oxide layer of the present invention is a reaction layer formed by the co-firing of a metallic conductor embedded in a ceramic dielectric oxide, wherein the resulting superconducting oxide layer is arranged at the interface between the sintered ceramic material and the metallic conductor. Particularly, the superconducting oxide reaction layer forms a sheath surrounding the metallic conductor.

The superconducting substrate of the present invention is obtained by co-firing one or more metallic conductors embedded in a ceramic dielectric oxide.

The processing conditions are selected to form an optimally oxidized superconducting oxide reaction layer at the interface between the sintered ceramic material and the metallic conductor, yet still leave a metallic core of the metallic conductor for normal electrical conduction. Thus, the superconducting substrate of the present invention superconducts by means of the superconducting sheath at temperatures below the superconducting transition temperature of the superconducting oxide reaction layer, while the substrate also conducts at temperatures above the superconducting transition temperature by means of the metallic core.

The ceramic dielectric oxide for use as a starting material for forming the superconducting substrates of the present invention may be prepared in reference to the disclosure of W. Kwestroo, H. A. M. Van Hal, and C. Langereis, *Compounds in the System BaO—$Y_2O_3$*. Mat. Res. Bull., vol. 9, pp. 1631–1638 (1974). For example, for preparing DBYO ($Ba_4Y_2O_7$) ceramic dielectric particles, stoichiometric amounts of $BaCO_3$ and $Y_2O_3$ are ground together with a compatible solvent in an agate mortar to provide a mixed slurry. The slurry is then dried and pressed into a pellet. The pellet is then fired in air, reground and repressed. Following a second firing, the pellet is reground to provide the starting ceramic dielectric particles or DBYO. The grinding, pressing and firing operations may be performed a third or more times, as necessary.

Likewise, to prepare $Bi_2Sr_2CaO_6$ ceramic dielectric particles for use in forming the corresponding Bi—Sr—Ca—Cu—O superconducting ceramic system, stoichiometric amounts of $Bi_2O_3$, $CaCO_3$ and $SrCO_3$ constitute the starting materials, which are ground, pressed and reground, as in the case of preparing DBYO.

We expect that in addition to DBYO and $Bi_2Sr_2CaO_6$, useful ceramic dielectric oxides for use in preparing the superconducting substrates of the present invention include those represented by the formula $M^{II}_xM^{III}_yO_{(x+3/2y)}$, where $M^{II}$ is at least one element selected from Ba, Sr, Ca, Pb and Mg; $M^{III}$ is at least one element selected from Y, Bi, Sc, La, Ce, Pr, Nd, Sm, Eu, Gd, Db, Dy, Ho, Er, Tm, Yb and Lu; x is from 0 to 4; and y is from 1 to 2.

The particle size of the ceramic dielectric particles thus prepared is generally from 2 $\mu$m-8 $\mu$m, which, in part, provides an appropriate degree of porosity of the resulting sintered body.

In the first embodiment of the invention, the at least one metallic conductor may be embedded in the ceramic dielectric oxide by means of, for example, sputtering or laser ablation from a pressed disk target of the ceramic dielectric oxide material onto the metallic conductor previously deposited on top of another disk of the dielectric oxide, followed by pressing to confine the metallic conductor within the dielectric oxide material. Also, a thick slurry of the ceramic dielectric particles may be applied to the metallic conductor followed by subsequent drying and firing. Additionally, the ceramic dielectric particles may be molded together with the metallic conductor to provide a pellet having the metallic conductor embedded therein, depending on the desired form of the superconducting substrate.

If even a thin layer (e.g., about 1 to 20 $\mu$m, approximately the particle size) of the ceramic dielectric oxide is simply applied to the metallic conductor such that the entire ceramic dielectric oxide is reacted with the metal, or such that the metallic conductor is not embedded within the ceramic dielectric oxide, the resulting superconducting oxide reaction layer tends to scale off of the metallic conductor. However, in the present invention, the sintered ceramic material (e.g., DBYO) confines the superconducting reaction layer and also serves as a good insulator.

The metallic conductor of the present invention comprises copper, from about 0 to 80 mol % gold and from about 0 to 80 mol % silver. Complications can arise from low-melting metallic eutectics. In a preferred embodiment, the metallic conductor comprises copper and not more than two other metals selected from silver and gold. The metallic conductor must contain sufficient copper to form the superconducting oxide reaction layer. A metallizing paste containing these metals may also be used. A metallizing paste or metallic conductor composition containing from one mole to three moles of gold to one mole of copper is especially useful. The metallizing paste is advantageously used in preparing the superconducting multilayer ceramic substrate of the present invention.

In addition to a wire or a metallization pattern (i.e., metallic conductor lines) formed from a metallization paste, the metallic conductor may take the form of a tubular member, wherein the superconducting oxide reaction layer is formed at either or both of the inner and outer surfaces thereof. Such a superconducting substrate may advantageously be used together with a cooling fluid.

To establish electrical contact (e.g., terminal means), appropriate portions of the superconducting ceramic substrate or superconducting multilayer ceramic substrate of the present invention may be, for example, lapped and polished to expose the center metallic core and surrounding superconducting oxide sheath to provide a contact pad. A superconducting paste or other appropriate conductive material is then applied to the contact pad.

In forming a superconducting multilayer ceramic (MLC) substrate of the present invention, reference is made to U.S. Pat. No. 4,301,324 to Kumar et al, U.S. Pat. No. 4,540,621 to Eggerding et al and U.S. Pat. No. 4,598,167 to Ushifusa et al, with regard to the structural features and materials typically included in a MLC, and with regard to the various preliminary steps in forming a laminate of the metallized sheets prior to the co-firing steps. In general, these methods comprise the steps of:

(a) admixing ceramic dielectric particles (i.e., a powder) with a binder and solvent therefor;

(b) casting said mixture into a sheet;

(c) drying said cast sheet into a self-supporting green sheet;

(d) punching the green sheet to provide via holes for interconnection;

(e) depositing a metallization pattern onto said dried sheet including providing interconnecting means and means for extending the pattern to at least one surface of a laminate of the metallized sheets; and (f) laminating a plurality of the metallized sheets together.

The superconducting MLC of the present invention, however, is fabricated with different starting materials (e.g., the particular composition of the ceramic dielectric particles), and is fired in a different manner than a conventional MLC, in order to obtain the structure and effect of the invention.

In a step preliminary to the firing step, the binder is removed preferably at a temperature less than 250° C. in a wet nitrogen atmosphere, for example, or other low oxygen atmosphere.

According to the present invention, after binder removal the laminate is then fired to form a superconducting oxide reaction layer at the interface between the sintered ceramic material and the embedded metallic conductor lines, without oxidizing the core of the metallic conductors, and in a manner in which unwanted phases, as described above, are minimized.

For DBYO, and as applied to all embodiments of the invention employing DBYO, the desired results are obtained when the co-firing step constitutes two individual steps, including (i) co-firing the ceramic dielectric oxide and metallic conductor in a substantially non-oxidizing atmosphere to form a porous sintered body of the dielectric oxide having the metallic conductor embedded therein, and (ii) annealing the substrate in an atmosphere containing oxygen in a final firing step to thereby optimally oxidize the superconducting oxide layer formed at the interface between the sintered dielectric oxide and the metallic conductor, without oxidizing the core of the metallic conductor.

In the first firing step, the DBYO is fired to the extent that it is partially densified, wherein the openings between the sintered particles are partially interconnected. The porosity of the partially densified ceramic material has a void space of at least 15% based on the density of the solid.

The first critical reaction to form superconducting oxide in the firing step is conducted at a temperature of from 800° to 975° C. and preferably from 850° to 925° C. in an atmosphere containing from $3\times10^{-4}$ to $5\times10^{-2}$ atmosphere and preferably from $1\times10^{-3}$ to $2\times10^{-2}$ atmosphere of oxygen, which may contain dry nitrogen or another inert gas, at a time of from five minutes to three hours, depending on the geometry of the substrate. In the first firing step, a tetragonal phase of the 123 layer is formed. The porous nature of the sintered body subsequent to the first firing step allows for oxygen to diffuse into the sintered body in the subsequent annealing step, to thereby convert the tetragonal 123 layer to the orthorhombic superconducting phase thereof.

In fabricating the superconducting MLC of the invention, the small amount of oxygen in the first firing step also serves to decompose any residual binder.

The annealing step is carried out, for example, in air or pure oxygen at a temperature of from 350° to 500° C. and preferably from 400° to 450° C. for 1 to 4 hours, depending on the geometry of the substrate. The higher concentration oxygen atmosphere of the annealing step is not introduced into the furnace until the substrate is at a temperature below the point of the tetragonal to orthorhombic phase transition. The resulting 123 superconducting oxide layer of from 2 to 80 $\mu$m forms at the interface between the sintered DBYO and the metallic conductor, without oxidizing the core of the metallic conductor.

The first firing step and the subsequent annealing step may be carried out in the same furnace. In order to minimize thermal stress in the transition between the first firing step and the lower temperature annealing step, the furnace is preferably ramped down at a rate of from 1° to 5° C./min.

In general, the insulating portion of an MLC substrate preferably has a low dielectric constant in order to enhance performance and to increase operating speed. The present inventors have surprisingly found that the sintered DBYO body of a superconducting MLC of the present invention has a dielectric constant of about 6 and a loss tangent of less than 0.001. This is an extremely desirable result which could not have been expected from the constituent oxides alone. Moreover, the sintered DBYO body also serves as an excellent insulator.

The thickness of the metallic conductor of the invention is such that the firing and oxidation annealing steps are carried out without oxidizing the core of the metallic conductor. There is no particular restriction with regard to the upper limit thickness of the metallic conductor, although to be useful in an MLC substrate, the metallic conductor must be dimensionally in scale with the required interconnecting patterns.

When a copper wire is employed as the metallic conductor, the wire has a diameter sufficient to provide the copper required to form the superconducting oxide reaction layer, yet leave an unoxidized core for metallic conduction, and the wire generally has a diameter of at least 25 $\mu$m. Likewise, in the fabrication of superconducting substrates for carrying and interconnecting semiconductor devices (e.g., an MLC) in accordance with the present invention, the metallic conductor, which is typically formed from a metallizing paste, generally has a deposited thickness, before firing, of at least 25 $\mu$m, and a minimum printed width of 50 $\mu$m, and preferably at least 75 $\mu$m. Metallic conductors deposited by other means, e.g., evaporation, could be smaller. Reaction oxygen pressures influence these considerations also.

In the superconducting multilayer ceramic substrate of the present invention, the edge-to-edge distance between adjacent metallic conductors is at least 50 $\mu$m and preferably at least 75 $\mu$m, to provide an adequate amount of the insulating sintered ceramic material therebetween.

A key processing criticality is the oxidizing of the superconducting oxide layer at the interface between the metallic conductor and the ceramic dielectric oxide to a superconducting condition without oxidizing the metallic core.

Preferably, the reaction layer consumes not more than 90%, and more preferably not more than 50% of the metallic conductor.

When a gold-containing metallic conductor or metallizing paste thereof is used instead of copper alone, the processing parameters for the firing and annealing steps are less restrictive because the gold content of the metallic conductor is not subject to oxidation. Thus, for example, we expect that for a DBYO and a gold-containing metallic conductor system, the 123 reaction layer thus formed may be converted to the orthorhombic superconducting phase in a single firing step with an oxidizing atmosphere during both heating and cooling. Also, we expect that a gold-containing metallizing paste is particularly useful in fabricating a superconducting MLC of the invention having a larger number of layers and a thicker geometry. In this regard, the 123 layers in the center portions of the substrate may be optimally oxidized, while still leaving a continuous gold metallic phase of the metallic conductors in the outer portions of the substrate initially exposed to a higher oxidizing concentration in the oxidative firing or annealing step. This will further aid in the removal of organic binder by oxidation with a more oxygen rich atmosphere than could be used otherwise.

For $Bi_2Sr_2CaO_6$, the desired results are obtained when the co-firing step is a single step operation wherein the ceramic dielectric oxide and metallic conductor are co-fired to form the superconducting oxide layer at the interface between the sintered ceramic material and the metallic conductor. After co-firing, the substrate may be annealed to densify the ceramic body, as required.

For forming a superconducting substrate of the Bi—Sr—Ca—Cu—O system according to the invention, the first firing step is conducted at a temperature of from 850° to 890° C. in air or in at least $10^{-4}$ atmosphere of oxygen, which may also contain nitrogen or another inert gas, at a time of from 0.5 to 20 hours, depending on the geometry of the substrate, the particle size of the dielectric ceramic and the oxygen pressure.

The subsequent densification annealing step is carried out at a temperature of from 400° to 650° C. and preferably at a temperature of 550° to 650° C. for ten to fifteen minutes in from $10^{-2}$ to $10^{-4}$ atmosphere of oxygen.

In the fabrication of a superconducting multilayer ceramic substrate of the present invention, the continuous porosity of the sintered ceramic dielectric oxide body may be substantially filled with a low dielectric constant polymer in a final post-sintering step by, for example, a vacuum/backflow process. The polymer advantageously lowers the dielectric constant of the non-metallic portion of the multilayer ceramic, as well as protects the MLC assembly against external chemical agents.

As used herein, the expression "substantially fills" means that the resulting substrate containing the cured polymer has a void volume of not more than about 10% based on the density of the solid. The avoidance of a connected pore structure is critical, and that notwithstanding, a preferred structure can be a formed polymer with a >10% closed porosity taking advantage of the low dielectric constant of air ($\epsilon=1$).

The polymer for use in the final post-sintering step is a low viscosity polymer which is cross-linkable upon subsequent curing. The polymer also preferably has a dielectric constant of less than about 3.5. Useful polymers include liquid crystal polymers and copolymers of siloxane and polyimide, and fluorinated polymers.

In a typical vacuum/backflow process for use in penetrating the thus fabricated superconducting MLC with a polymer, the sintered sample is immersed in a bath of the fluid polymer, and the chamber containing the substrate immersed in the polymer is then evacuated to a pressure of less than about 100 torr. The time for immersion depends upon the viscosity of the polymer selected, the degree of porosity of the substrate and the shape of the substrate, although an immersion time of at least 10 minutes may generally be employed.

After immersion of the substrate into the polymer to thereby substantially fill the void space in the sintered ceramic material, the polymer is cured by any known means suitable for use with the selected polymer.

The curing temperatures should be less than 250° C. to avoid degenerative reactions between, for example, 123 and hydrocarbon polymers.

The present invention is described in detail with reference to the following examples, but the present invention is not to be construed as being limited thereto.

EXAMPLE 1

Stoichiometric amounts of powdered $Bi_2O_3$, $CaCO_3$ and $SrCO_3$, each having a purity of at least 99.99%, were ground together with acetone in an agate mortar, to obtain a thick slurry. The slurry was then dried under nitrogen gas at about 110° C. for about one hour. The dried powder was then pressed at about 55 MPa in a "Specimen Mount" press made by Buehler Ltd., Lake Bluff, Ind. to obtain a pellet of about 2.5 cm in diameter and 0.4 cm in thickness. The pellet was then fired in air in a Tempmaster furnace model 2, made by the Jelrus Company. Specifically, the pellet was inserted into the furnace at room temperature, and then ramped at a rate of 20° C./min to 438° C., and then at 2.8° C./min to 790° C. The pellet was then fired at 790° C. for forty-seven hours. The sample was then removed from the furnace and cooled at room temperature. The fired pellet was then reground and repressed, employing the same procedure as above, except that the second firing was carried out at 850° C. for sixty-five hours. The pellet was then removed and cooled in a stream of dry nitrogen gas for about 5 minutes and then placed in a desiccator over CaO powder.

The twice fired material was then ground in an agate mortar to provide 1.32 grams of a ground dielectric ceramic oxide powder. About 1.2 grams of the ground material was pressed at about 35 MPa, to obtain a pellet having a diameter of about 1.5 cm and a thickness of about 0.2 cm.

Two copper wires having a diameter of about 0.025 cm and 0.013 cm, respectively, and each having a length of about 1.5 cm, were positioned on top of the pellet. The remainder of the twice fired and ground material was then spread over the top of the wires. The thus prepared assembly was repressed at about 138 MPa, to embed the two wires into the substrate.

The pressed pellet containing the embedded copper wires was then annealed in an atmosphere of 1% $O_2$ and 99% $N_2$ in the furnace portion of a Cahn TG-131 (Cerritos, Calif.) thermogravimetric analyzer. After inserting the assembly into the furnace at room temperature, the furnace was ramped up at a rate of 20° C./min to 840° C., then 5° C./min to 870° C. and annealed for one hour at 870° C. Next, the furnace was ramped down at a rate of 10° C./min to 450° C., at which temperature the specimen was further annealed for an additional ten minutes. Afterwards, the furnace was cooled and the annealed assembly was removed at about 195° C. and then placed in a desiccator.

Two positions along each of the embedded wires were scraped to expose the superconducting oxide sheath surrounding the metallic core.

Silver Skin SC-20 (Microcircuits Co., New Buffalo, Minn.) contact paint was employed at the exposed portions to electrically contact the thus formed superconducting substrate.

The dielectric constant of the sintered ceramic dielectric oxide substrate was measured to be about 13. The sintered substrate had a void space of about 20% based on the density of the solid.

A four point resistance measurement as a function of temperature along a distance of 0.8 cm of the 0.025 cm wire and surrounding superconducting oxide sheath of the superconducting substrate thus prepared was performed. The substrate was both superconducting and also conducted in a normal metallic conduction mode above the superconducting transition temperature. The onset of superconductivity was observed to be about 92° K. The resistance of the superconducting layer alone at temperatures above the superconducting transition temperature in the absence of the unoxidized metallic core would be expected to be no lower than 0.5 to 1.0 Ω if separated from the copper core. However, the resistance of the conductor copper core above the superconducting transition temperature (namely, at room temperature) actually was 0.03 Ω, thus demonstrating that the substrate was both superconducting, and operated at temperatures above the superconducting transition temperature in a normal metallic conduction mode as well.

EXAMPLE 2

In this example, a superconducting MLC of the invention comprising three layers is prepared, each layer being about 0.2 mm thick and having dimensions of 185 mm×185 mm.

Stoichiometric amounts of $BaCO_3$ and $Y_2O_3$ are ground together in an agate mortar with absolute ethanol to obtain a thick slurry. The slurry is dried at about 110° C. for about one hour. A pellet having a diameter of 4.0 centimeters and a thickness of 0.8 centimeters is prepared by pressing the dried mixture at about 35 MPa. The pressed pellet is then fired in air for about 16 hours at about 1050° C. The fired pellet is then reground, repressed and refired, employing the same procedure as described above, and it is then removed and cooled in a stream of dry nitrogen for about five minutes.

Water vapor and carbon dioxide are to be avoided because they react with BaO.

The thus fired DBYO phase has $\epsilon=6$ and tan 6 less than 0.0005, and a bulk resistivity of $10^9$ohm.cm.

The twice fired ceramic dielectric material is then ground to an average particle size of 5 microns.

For casting "green sheets", the binder selected is polyvinylbutyral (Butvar B-98 from Monsanto) containing about 20 wt % dipropyleneglycol-dibenzoate based on the PVB weight.

The solvent selected is a mixture of methanol and methylisobutylketone (1:3 parts by weight).

The DBYO ceramic dielectric particles, binder and solvent in portions of 64 wt %, 6 wt % and 30 wt %, respectively, based on the total slurry weight, is then milled in a conventional fashion.

A green sheet having a thickness of about 0.2 mm is prepared from the slurry thus obtained using a conventional doctor blading technique.

The green sheet is then dried and aired for 24 hours, and then cut into working blanks having dimensions of 185 mm×185 mm. Registration holes are punched therein in a conventional manner.

Thereafter, via holes having a diameter of 150 $\mu$m are selectively punched on a standard grid pattern in each working blank.

Following the above procedure, the via holes are filled from the bottom and then the top in a conventional manner using a copper and gold metallization paste (85 wt % metal, the balance being a conventional polymeric binder and solvent, wherein the metallizing paste contains one mole of gold to one mole of copper).

Thereafter, a wiring pattern is formed by screen printing the above-described metallization paste on each working blank in a conventional manner, to thereby form the desired metallization pattern on the working blanks.

Next, three of the above blanks are stacked and laminated together at a temperature of 75° C. and a pressure of about 27 MPa for 5 minutes.

Binder removal is preferably achieved at temperatures below 250° C.

Thereafter, the MLC intermediate is fired at a temperature of 900° C. in $6\times10^{-3}$ atmosphere of oxygen for 45 minutes. The temperature of the furnace is then lowered to a temperature of 425° C., until the substrate is at equilibrium with the new furnace temperature. The atmosphere in the furnace is then changed to air, and the substrate is annealed for 1½ hours.

Following these steps should result in an oxidized 123 superconducting reaction layer being formed at the interface of the resulting metallic metallization pattern (i.e., the metallic conductor lines and interconnecting vias) and the sintered ceramic dielectric oxide, wherein the 123 layer is converted to the orthorhombic superconducting phase, while leaving an unoxidized, metallic core of the metallization pattern and interconnecting vias.

Contact pads are formed by lapping and polishing the terminal portions of the superconducting MLC substrate to expose the center metallic core and surrounding superconducting oxide sheath. Electrical contact to the contact pads is made by means of a superconducting paste.

Upon measurement of resistance with a 4 point probe in the conventional manner, the thus prepared substrate should exhibit superconductivity at liquid nitrogen temperature, and conduct in a normal metallic conduction mode at temperatures above the superconducting transition temperature.

While the invention has been described in detail and with reference to specific examples thereof, it will be apparent to one skilled in the art that various changes and modifications can be made therein without departing from the spirit and scope thereof.

What is claimed is:

1. A superconducting ceramic substrate prepared by co-firing at least one metallic conductor embedded in a ceramic dielectric oxide, to thereby form a superconducting oxide reaction layer at the interface between the sintered ceramic material and the at least one metallic conductor, wherein said metallic conductor comprises copper, and said ceramic dielectric oxide is represented by the formula $M^{II}_xM^{III}_yO_{[x+3/2y]}$, where $M^{II}$ is at least one element selected from Ba, Sr, Ca, and Mg; $MI^{III}$ is at least one element selected from Y, Bi, Sc, La, Ce, Pr, Nd, Sm, Eu, Gd, Tb, Dy, Ho, Er, Tm, Yb and Lu; x is from 0 to 4; and y is from 1 to 2.

2. A superconducting ceramic substrate as in claim 1, further comprising terminal means for extending the at least one metallic conductor and superconducting oxide reaction layer to a surface of the substrate.

3. A superconducting ceramic substrate as in claim 1, wherein the superconducting ceramic substrate operates at temperatures above the superconducting transition temperature of the superconducting oxide reaction layer.

4. A superconducting ceramic substrate as in claim 1, wherein said at least one metallic conductor comprises copper and not more than two other metals selected from gold and silver.

5. A superconducting ceramic substrate as in claim 1, wherein said at least one metallic conductor comprises from one mole to three moles of gold to one mole of copper.

6. A superconducting ceramic substrate as in claim 1, wherein said at least one metallic conductor is a tubular member.

7. A superconducting substrate as in claim 1, wherein said ceramic dielectric oxide is $Ba_4Y_2O_7$ or $Bi_2Sr_2CaO_6$.

8. A superconducting ceramic substrate as in claim 1, wherein the ceramic dielectric oxide is $Bi_2Sr_2CaO_6$, the at least one metallic conductor is copper, and the superconducting oxide reaction layer comprises a superconducting ceramic of the Bi—Sr—Ca—Cu—O system.

9. A superconducting ceramic substrate as in claim 1, wherein the ceramic dielectric oxide is $Ba_4Y_2O7$, the at least one metallic conductor is copper, and the superconducting oxide reaction layer comprises a superconducting ceramic of the Ba—Y—Cu—O system.

10. A superconducting ceramic substrate as in claim 1, wherein the superconducting oxide reaction layer is formed at the interface between the sintered ceramic material and the metallic conductor without completely oxidizing the metallic conductor.

11. A superconducting ceramic substrate as in claim 1, wherein not more than 90% of the embedded metallic conductor is consumed in forming the superconducting oxide reaction layer.

12. A superconducting ceramic substrate as in claim 1, wherein not more than 50% of the embedded metallic conductor is consumed in forming the superconducting oxide reaction layer.

13. A superconducting ceramic substrate as in claim 1, wherein the ceramic dielectric oxide is an insulator.

14. A superconducting ceramic substrate as in claim 1, wherein the superconducting oxide reaction layer forms a sheath surrounding the metallic conductor.

15. A superconducting ceramic substrate as in claim 1, wherein $M^{III}$ is at least one element selected from Y, Bi, Sc, La, Ce, Pr, Nd, Sm, Eu, Gd, Dy, Ho, Er, Tm, Yb and Lu.

16. A superconducting ceramic substrate as in claim 1, wherein $M^{III}$ is at least one element selected from Y, Bi, Sc, La, Nd, Sm, Eu, Gd, Dy, Ho, Er, Tm, Yb and Lu.

17. A superconducting ceramic substrate as in claim 1, wherein $M^{II}$ is at least one element selected from Ba, Sr and Ca.

18. A superconducting ceramic substrate as in claim 1, wherein x is from 1 to 4.

19. A superconducting multilayer ceramic substrate prepared by firing a laminate of at least two polymer bonded cast sheets of a ceramic dielectric oxide powder, at least one sheet of which has a metallization pattern provided thereon, the metallization pattern is arranged between adjacent sheets or within any given sheet of the laminate, to thereby form a superconducting oxide reaction layer at the interface between the sintered ceramic material and the embedded metallic conductor lines of the metallization pattern, wherein said metallic conductor comprises copper, and said ceramic dielectric oxide is represented by the formula $M^{II}_x M^{III}_y O_{[x+3/2y]}$ where $M^{II}$ is at least one element selected from Ba, Sr, Ca, and Mg; $M^{III}$ is at least one element selected from Y, Bi, Sc, Ce, Pr, La, Nd, Sm, Eu, Gd, Tb, Dy, Ho, Er, Tm, Yb and Lu; x is from 0 to 4; and y is from 1 to 2.

20. A superconducting multilayer ceramic substrate as in claim 19, further comprising terminal means for extending the pattern of the metallic conductor lines and superconducting oxide reaction layer to a surface of the substrate for electrical connection thereto.

21. A superconducting multilayer ceramic substrate as in claim 19, further comprising a plurality of spaced and interconnected metallization patterns.

22. A superconducting multilayer ceramic substrate as in claim 19, wherein the superconducting multilayer ceramic substrate operates at temperatures above the superconducting transition temperature of the superconducting oxide reaction layer.

23. A superconducting multilayer ceramic substrate as in claim 19, wherein the ceramic dielectric oxide is $Bi_2Sr_2CaO_6$, the metallic conductor comprises from one mole to three moles of gold to one mole of copper and the superconducting oxide reaction layer is a superconducting ceramic of the Bi—Sr—Ca—Cu—O system.

24. A superconducting multilayer ceramic substrate as in claim 19, wherein the ceramic dielectric oxide is $Ba_4Y_2O_7$, the metallic conductor comprises from one mole to three moles of gold to one mole of copper and the superconducting oxide reaction layer is a superconducting ceramic of the Ba—Y—Cu—O system.

25. A superconducting multilayer ceramic substrate as in claim 19, wherein the metallic conductor comprises copper and not more than two other metals selected from gold and silver.

26. A superconducting multilayer ceramic substrate as in claim wherein the metallic conductor comprises from one mole to three moles of gold to one mole of copper.

27. A superconducting multilayer ceramic substrate as in claim 19, wherein the sintered ceramic material comprises pores having a void space.

28. A superconducting multilayer ceramic substrate as in claim 27, further comprising a cured polymer selected from the group consisting of liquid crystal polymers, copolymers of siloxane and polyimide, and fluorinated polymers which substantially fills the void space of the sintered ceramic material.

29. A superconducting multilayer ceramic substrate as in claim 28, wherein the polymer has a dielectric constant of less than about 3.5.

30. A superconducting multilayer ceramic substrate as in claim 19, wherein $M^{III}$ is at least one element selected from Y, Bi, Sc, La, Ce, Pr, Nd, Sm, Eu, Gd, Dy, Ho, Er, Tm, Yb and Lu.

31. A superconducting multilayer ceramic substrate as in claim 19, wherein $M^{III}$ is at least one element selected from Y, Bi, Sc, La, Nd, Sm, Eu, Gd, Dy, Ho, Er, Tm, Yb and Lu.

32. A superconducting multilayer ceramic substrate as in claim 19, wherein $M^{II}$ is at least one element selected from Ba, Sr and Ca.

33. A superconducting multilayer ceramic substrate as in claim 19, wherein x is from 1 to 4.

34. A superconducting ceramic substrate prepared by co-firing at least one metallic conductor embedded in a ceramic dielectric oxide, to thereby form a superconducting oxide reaction layer at the interface between the sintered ceramic material and the at least one metallic conductor, wherein said metallic conductor comprises copper, and said ceramic dielectric oxide is represented by the formula $M^{II}_x M^{III}_y O_{[x+3/2y]}$, where $M^{II}$ is at least one element selected from Ba, Sr, Ca, Pb and Mg; $M^{III}$ is at least one element selected from Y, Bi, Sc, La, Ce, Pr, Nd, Sm, Eu, Gd, Tb, Dy, Ho, Er, Tm, Yb and Lu; x is from 0 to 4; and y is from 1 to 2.

35. A superconducting multilayer ceramic substrate prepared by firing a laminate of at least two polymer bonded cast sheets of a ceramic dielectric oxide powder, at least one sheet of which has a metallization pattern provided thereon, the metallization pattern is arranged between adjacent sheets or within any given sheet of the laminate, to thereby form a superconducting oxide reaction layer at the interface between the sintered ceramic material and the embedded metallic conductor lines of the metallization pattern, wherein said metallic conductor comprises copper, and said ceramic dielectric oxide is represented by the formula $M^{II}_x M^{III}_y O_{[x+3/2y]}$, where $M^{II}$ is at least one element selected from Ba, Sr, Ca, Pb and Mg; $M^{III}$ is at least one element selected from Y, Bi, Sc, La, Ce, Pr, Nd, Sm, Eu, Gd, Tb, Dy, Ho, Er, Tm, Yb and Lu; x is 0 to 4; and y is from 1 to 2.

* * * * *